(12) United States Patent
Kinoshita

(10) Patent No.: US 7,129,728 B2
(45) Date of Patent: Oct. 31, 2006

(54) LSI TEST SOCKET FOR BGA

(75) Inventor: Yasushi Kinoshita, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/553,189

(22) PCT Filed: Jul. 9, 2004

(86) PCT No.: PCT/JP2004/009832

§ 371 (c)(1),
(2), (4) Date: Jan. 23, 2006

(87) PCT Pub. No.: WO2005/006003

PCT Pub. Date: Jan. 20, 2005

(65) Prior Publication Data

US 2006/0132160 A1    Jun. 22, 2006

(30) Foreign Application Priority Data

Jul. 10, 2003    (JP)    .............................. 2003-272901

(51) Int. Cl.
*G01R 31/02* (2006.01)

(52) U.S. Cl. .................. 324/755; 324/754; 324/761; 324/762

(58) Field of Classification Search ................ 324/754, 324/755, 761, 762; 439/66–72
See application file for complete search history.

(56) References Cited

U.S. PATENT DOCUMENTS 6,512,389 B1 * 1/2003 Kocher ....................... 324/755
6,924,637 B1 * 8/2005 Casey et al. ............. 324/158.1
6,961,231 B1 * 11/2005 Alexander et al. ........ 361/321.2
2002/0180469 A1   12/2002 Wu et al.

FOREIGN PATENT DOCUMENTS

JP    2003-043068 A    2/2003
JP    2003-050262 A    2/2003

* cited by examiner

*Primary Examiner*—Ernest Karlsen
*Assistant Examiner*—Arleen M. Vazquez
(74) *Attorney, Agent, or Firm*—Foley & Lardner LLP

(57) ABSTRACT

There is provided an LSI socket containing a pogo-pin type decoupling capacitor for reducing the potential fluctuation of power supplies and GNDs at the time of testing LSI incorporated in a BGA package. The LSI socket comprises a printed board 102 containing decoupling capacitors 113 corresponding to one or more power supply voltages inside thereof, a pogo-pin supporting casing portion 104 on which the printed board 102 is overlapped into a single piece, and pogo-pins 103 inserted into penetrating holes in which hole positions of through holes 109 drilled in the printed board 102 and casing holes 114 drilled in the pogo-pin supporting casing portion 104 are allowed to be matched, wherein the printed board 102 is disposed on the upper surface side of the pogo-pin supporting casing portion 104 which faces the BGA package, or disposed on the lower surface side of the pogo-pin supporting casing portion 104, at the time of testing the LSI incorporated in the BGA package.

5 Claims, 5 Drawing Sheets

[FIG. 1]
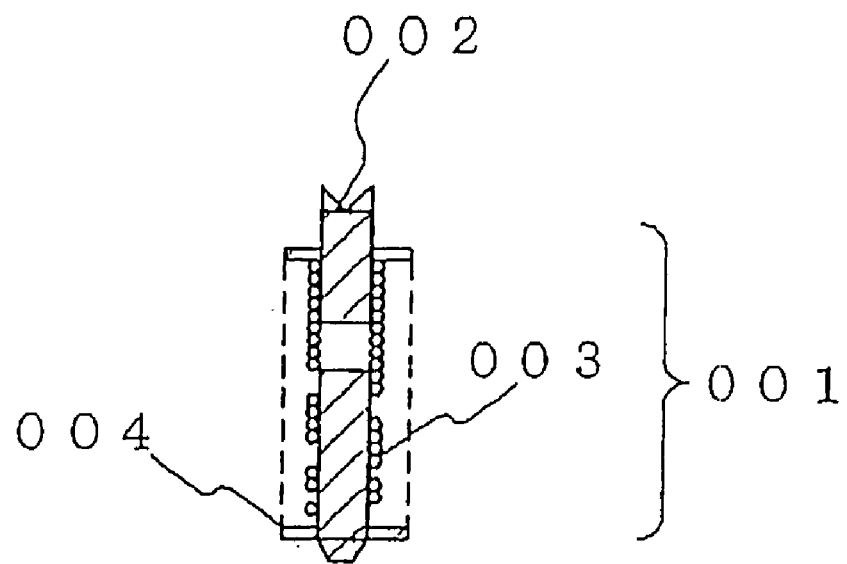
[FIG. 2A]
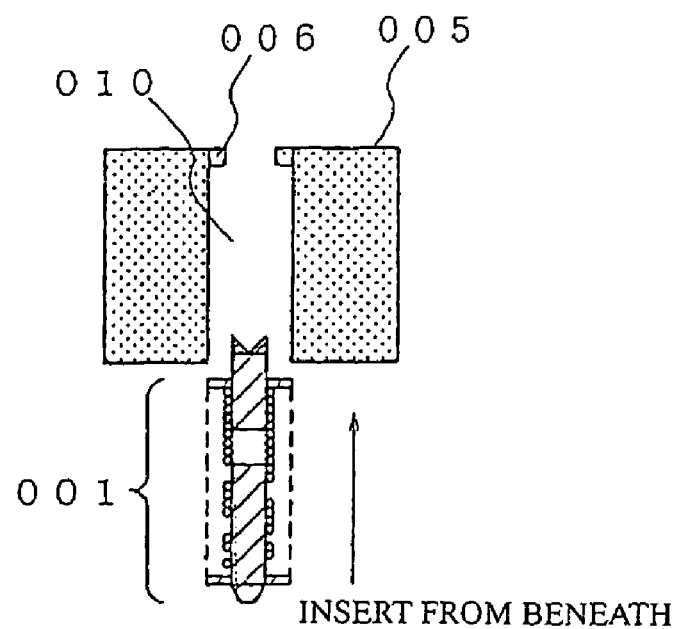
INSERT FROM BENEATH

[FIG. 2B]
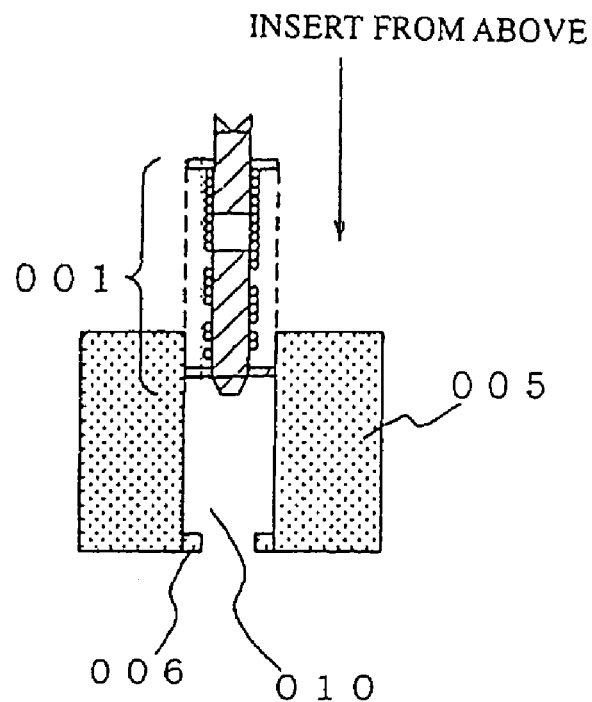
[FIG. 3A]
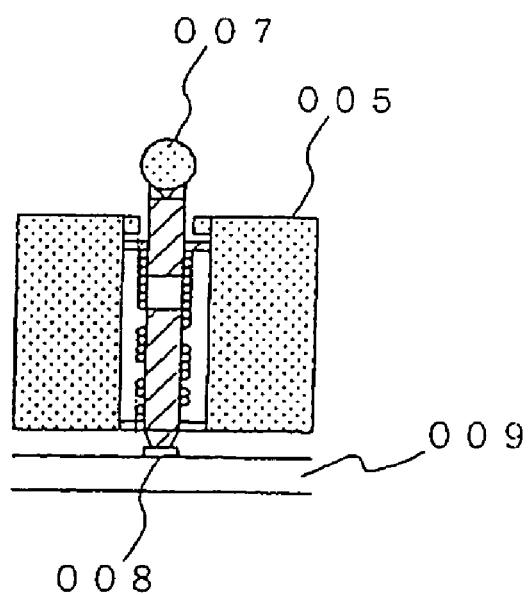

[FIG. 3B]
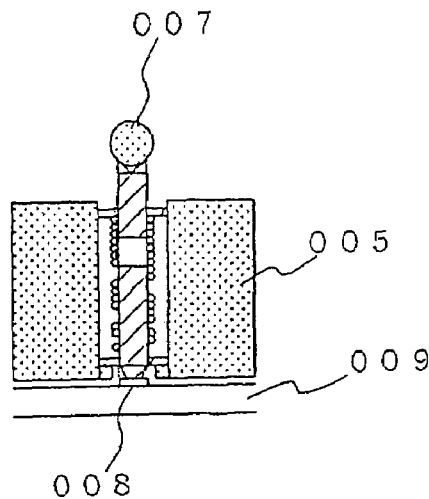
[FIG. 4]
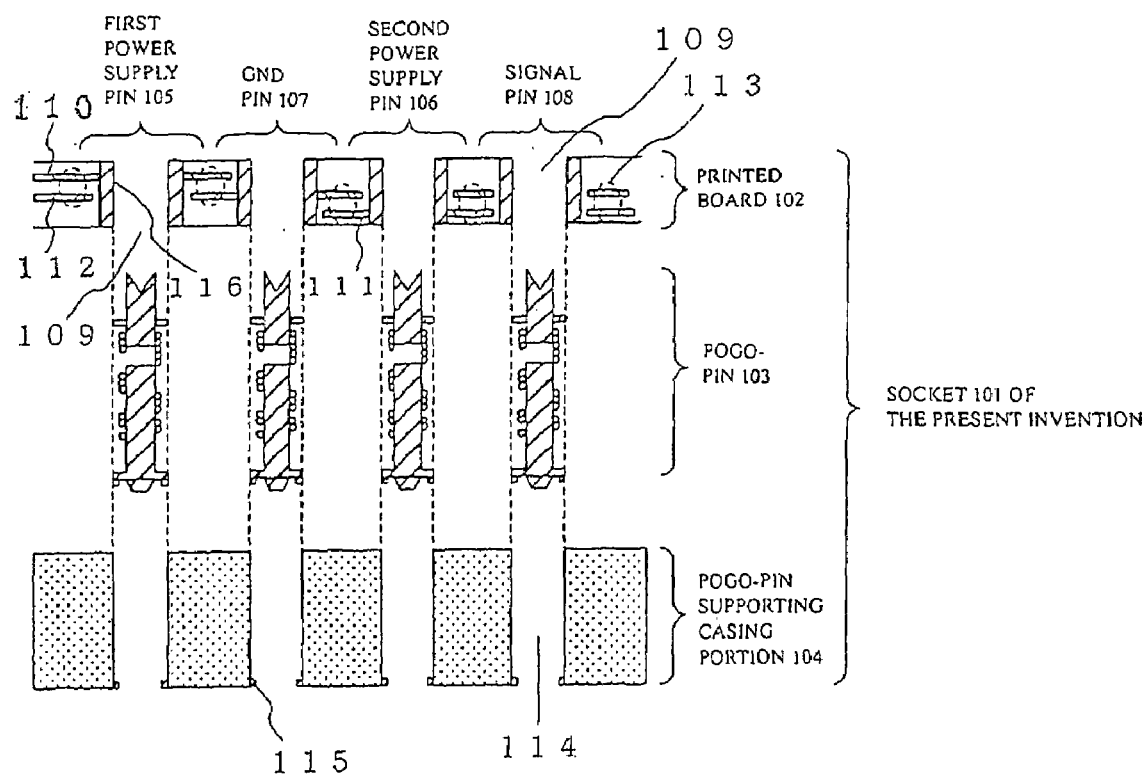

[FIG. 5]
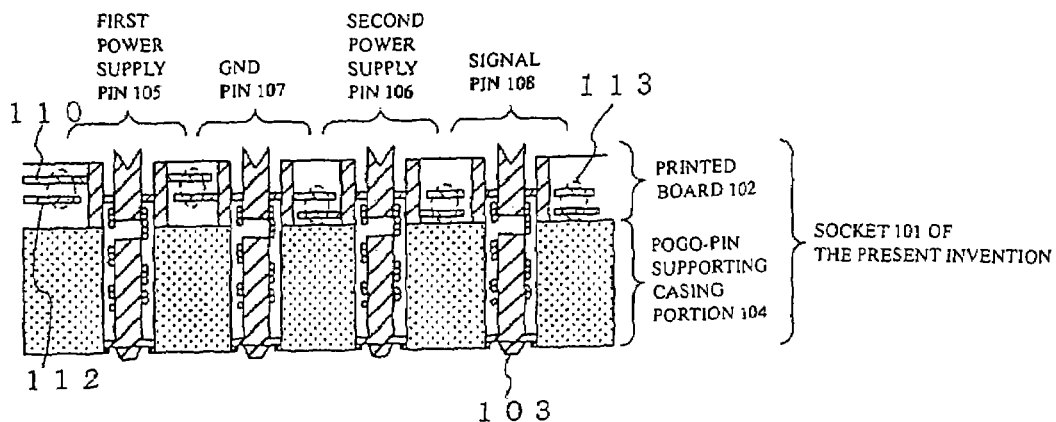
[FIG. 6]
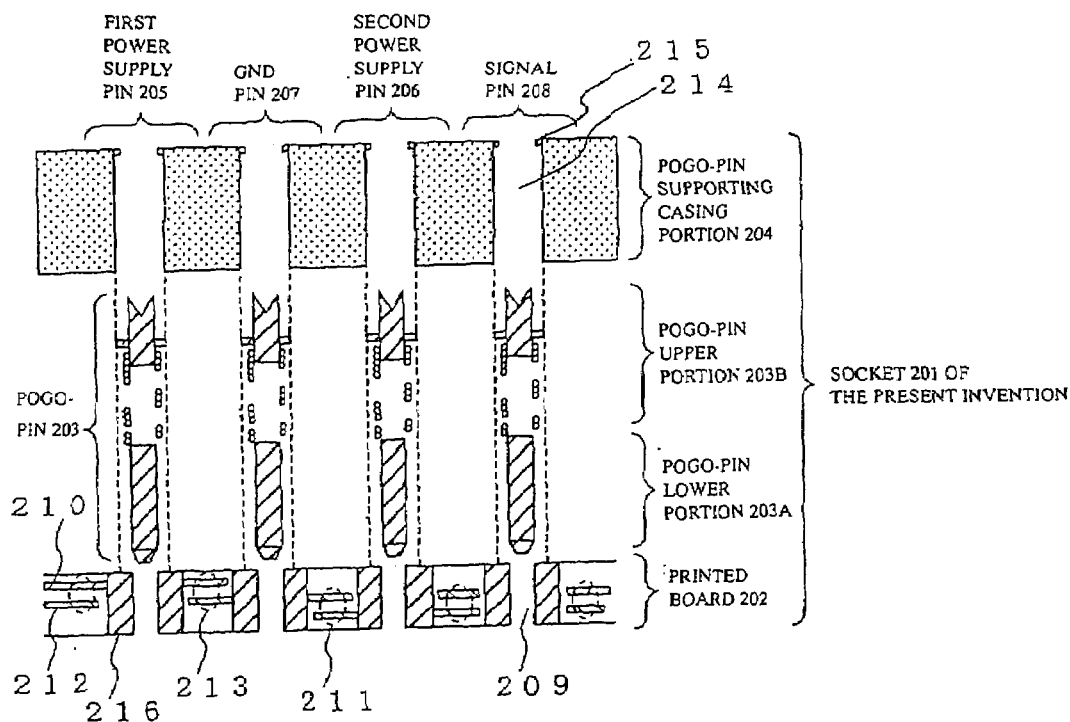

[FIG. 7]
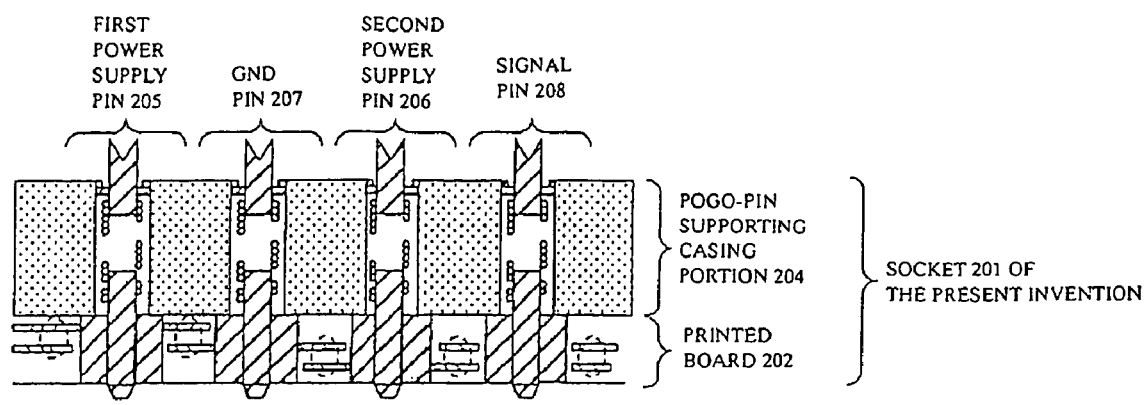

LSI TEST SOCKET FOR BGA

CROSS REFERENCE TO RELATED APPLICATIONS

This Application is a 371 of PCT/JPO4/09832, filed Jul. 9, 2004. has been inserted.

TECHNICAL FIELD TO WHICH THE INVENTION PERTAINS

The present invention relates to an LSI test socket used when inspecting LSI incorporated in a BGA (Ball Grid Array) package, and in particular to the structure of an LSI test socket for BGA used when checking an electrical parameter and the like.

BACKGROUND ART

For the purpose of more adequately describing a technological level for the present invention at present, all descriptions of the patents, patent applications, patent gazettes, scientific papers, and the like which are cited or specified in the present application will be incorporated herein by reference.

Conventionally, an LSI test socket (hereinafter, referred to as an LSI socket) has been used to avoid thermal and mechanical damage to a solder ball in a BGA package when conducting a screening test on LSI incorporated in a high-density and multi-pin BGA package. An LSI socket used to accomplish this objective is largely divided into two types: a pogo-pin type and a sheet type.

The pogo-pin is called a spring pin or a spring probe pin, and composed of three components: a pogo-pin 001, a pin 002, and a spring 003, as shown in the cross-sectional view of FIG. 1. A pogo-pin type LSI socket using this pogo-pin is provided together with a pin in which coiled spring structure is supported by a resin casing to press above and below this pin, thereby providing the realization of an electrical connection.

FIG. 2A, FIG. 2B, FIG. 3A, and FIG. 3B are cross-sectional views showing the structure of conventional LSI sockets for BGA using pogo-pins, respectively. First, as shown in FIG. 2A and FIG. 2B, this LSI socket is composed of the pogo-pin 001 and a pogo-pin supporting casing portion 005 in combination. More specifically, the LSI socket has structure in which the pogo-pin 001 is inserted into a casing hole 010 from the upper side or the lower side of the pogo-pin supporting casing portion 005 which is made of nonconductive material such as resin.

FIG. 2A is a case in which the pogo-pin 001 is inserted into the casing hole 10 from the downside of the pogo-pin supporting casing portion 005 and fixed, with stoppers 006 located on the upper side of the pogo-pin supporting casing portion 005. On the other hand, FIG. 2B is a case in which the pogo-pin 001 is inserted into the casing hole 010 from the upper side of the pogo-pin supporting casing portion 005 and fixed, with the stoppers 006 located on the downside of the pogo-pin supporting casing portion 005.

In addition, FIG. 3A is a case in which the LSI socket with the structure of FIG. 2A is disposed on a test board 009, and FIG. 7B is a case in which the LSI socket with the structure of FIG. 2B is disposed on the test board 009. In either case, the pogo-pin 001 which is located corresponding to the position of a solder ball 007 of the LSI enclosed in the BGA package provides the realization of the electrical connection by pressing a wiring pad 008 on the test board 009 on which the LSI socket is mounted from above. In general, it is an advantage that this type of LSI socket is cheap in price because of simple structure, and may be repeatedly used because of great mechanical strength.

On the other hand, a sheet type LSI socket involves the use of a conductive sheet, and includes a metal fine wire embedded type and a conductive rubber type. The sheet type one may be shortened more than the aforementioned pogo-pin type one in pin length, and has the advantage of excellence in high frequency characteristics. However, the sheet type one has problems with much dust caused by metal oxide shavings, and high running cost due to expensive sheet, and further a problem with larger contact resistance because metal oxide is attached to the contacting surface.

Additionally, in the case of using any of these types of LSI sockets, a significantly serious problem has emerged along with high frequency and high power current operation of LSI in recent years. Test frequencies have become higher along with considerable performance improvement of LSI to be tested, and test conditions of the LSI incorporated in the BGA package have been conducted in a high frequency area of GHz order. This produces an extremely high power current, with the result that it is more likely that the potential fluctuation of power supplies and GNDs of the LSI occurs. There is another problem that it is difficult to supply power supplies with high quality in the vicinity of the BGA package because power supplies required for LSI operation are supplied from a tester far distant from the LSI when conducting an LSI screening test.

For this reason, if a capacitor cannot be disposed in the closest vicinity of a BGA package to be tested, a power current is produced by LSI high frequency operation to fluctuate the potential of power supplies and GNDs of the test board, leading to difficulty in ensuring operational stability of the LSI incorporated in the BGA package.

However, aside from this, a conventional LSI socket has an essential problem that a decoupling capacitor for reducing a swing of the potential fluctuation of the power supplies and the GNDs in the vicinity of the BGA package has become impossible to be mounted. It results from the facts that the number of electrodes of input/output signals, the power supplies and the GNDs of the LSI is increased by an improved integration degree more than before, and that the spacing between electrodes in the BGA package is narrowed to cause the electrodes to be densely packed by the miniaturization of the BGA package. In addition, even if the test frequency is less high, for example, LSI having as many as 512 of parallel input/output number has a problem that an enormously instantaneous power current flows at the time of 10 concurrent operation.

As a means of reducing the potential fluctuation of the power supplies and the GNDs described above, the sheet type LSI socket, for example, is intended to use a conductive sheet as a capacitor by connecting a plurality of electrodes on one side of the conductive sheet to a conductive layer, and allowing the conductive layer to be attached to the sheet to comprise a power supply layer, and by connecting a plurality of electrodes on the other side of the conductive sheet to the conductive layer, and allowing this conductive layer to be attached to the sheet to comprise a GND layer (for example, refer to Patent Document 1). This makes it possible to dispose a package sized capacitor immediately below the BGA package incorporating the LSI, whereby the effect of noise occurring in the power supplies and the GNDs at the time of the LSI high frequency operation may be reduced.

The conventional sheet type LSI socket described above has a problem with significantly difficulty in realization because of its structure, a problem with high running cost because of expensiveness and lack of sufficient stability for repeated use, and further a problem with lack of the contact ability of the LSI socket itself, with the result that it is not to be repeatedly used at a mass production level. Furthermore, the LSI in recent years mostly needs a plurality of power supply voltages, to which the sheet type cannot respond.

[Patent Document] Japanese Unexamined Patent Publication No. 2000-97991 (Page 3, FIG. 1 to FIG. 3)

[Disclosure of the Invention]

[Problems to be Solved by the Invention]

Consequently, it is an object of the present invention to provide a pogo-pin type LSI socket containing a decoupling capacitor for reducing the potential fluctuation of power supplies and GNDs in the vicinity of a BGA package at the time of a test, although it is made to solve problems occurring when testing LSI enclosed in the BGA package with a very large number of pins of input/output signals, power supplies, and GNDs at high frequencies, easy to replace socket pins, and has pogo-pin structure with low cost and high stability.

[Means for Solving the Problem]

A first aspect of the gist of the present invention provides an LSI test socket for BGA which comprises a printed board containing at least one or more decoupling capacitors in which a first power plate connected to an inner surface of a first through hole and a second power plate connected to an inner surface of a second through hole are laminated through a separator, a pogo-pin supporting casing portion on which said printed board is overlapped into a single piece, and in which at least one or more pairs of first and second casing holes are each opened at positions corresponding to said first and second through holes, and at least one or more pairs of first and second pogo-pins inserted into penetrating holes in which hole positions of said first and second through holes drilled in said printed board, and said first and second casing holes are allowed to be matched, wherein one end of the printed board faces a BGA package, said pogo-pin supporting casing portion being disposed at the other end thereof at the time of testing LSI incorporated in the BGA package. It should be noted that a power plate is a plate spread like a sheet which supplies a power supply, but not a signal, and is made of foil and other material such as metal having the function of electrodes of the decoupling capacitor, as well as potential which is applied to this plate includes not only power supply voltage potential, but also medium, GND, and further negative potential.

Power supply layers each corresponding to said first and second power plates and one GND layer are formed in the printed board, and the decoupling capacitors may be formed by the use of an electrostatic capacity between the power supply layers and the GND layer.

In the printed board, plating layers may be formed in inner surfaces of through holes into which power supply pogo-pins and a GND pogo-pin are inserted, except for a through hole into which a signal pogo-pin is inserted.

The pogo-pin supporting casing portion is made of non-conductive material, and the plating layers need not be formed in inner surfaces of the casing holes.

And, the power supply layers may be electrically connected to the plating layers in the inner surfaces of the through holes into which the power supply pogo-pins are inserted, and said GND layer may be electrically connected to the plating layer in the inner surface of the through hole into which the GND pogo-pin is inserted.

A second aspect of the gist of the present invention provides an LSI test socket for BGA which comprises a printed board containing decoupling capacitors in which a first power plate connected to an inner surface of a first through hole and a second power plate connected to an inner surface of a second through hole are laminated through a separator, a pogo-pin supporting casing portion on which the printed board is overlapped into a single piece and in which first and second casing holes are each opened at positions corresponding to said first and second through holes, and pogo-pins inserted into penetrating holes in which hole positions of said first and second through holes drilled in said printed board, and said first and second casing holes are allowed to be matched, wherein one end of said pogo-pin supporting casing portion faces a BGA package, said printed board being disposed at the other end thereof at the time of testing LSI incorporated in the BGA package.

Power supply layers each corresponding to said first and second power plates and one GND layer are formed in the printed board, and the decoupling capacitors may be formed by the use of an electrostatic capacity between the power supply layers and the GND layer.

In the printed board, plating layers may be formed in inner surfaces of all through holes into which a signal pogo-pin, power supply pogo-pins and a GND pogo-pin are inserted.

Said pogo-pin supporting casing portion is made of non-conductive material, and the plating layers need not be formed in inner surfaces of the casing holes.

The power supply layer may be electrically connected to the plating layers in the inner surfaces of the through holes into which the power supply pogo-pins are inserted, and said GND layer may be electrically connected to the plating layer in the inner surface of the through hole into which the GND pogo-pin is inserted, while the plating layer in the inner surface of the through hole into which the signal pogo-pin is inserted need not be electrically connected to the power supply layers and the GND layer.

And, the pogo-pins may be fixed by inserting the bottom of the pogo-pins into each corresponding through hole of the printed board and soldering through the plating layers.

[Effects of the Invention]

In accordance with the present invention, the potential fluctuation of power supplies of LSI operating at high frequencies may be reduced to allow for a stable operation test by containing a decoupling capacitor in an LSI socket for BGA. In addition, an LSI socket for BGA having better manufacturing stability and test stability may be realized by that a self-contained portion of the decoupling capacitor and a pogo-pin supporting casing portion are separated into portions of another layers.

BEST MODE FOR CARRYING OUT THE INVENTION

Hereinafter, an embodiment of the present invention will be described with the use of the drawings.

(First Embodiment)

A first embodiment of the present invention will be described below. FIG. 4 is an exploded longitudinal sectional view showing each component comprising an LSI socket for BGA in accordance with the present invention. FIG. 5 is a longitudinal sectional view showing an LSI socket for BGA illustrating the first embodiment in accordance with the present invention.

As shown in FIG. 4, an LSI socket 101 in accordance with the present invention is composed of three components: a printed board 102, pogo-pins 103, and a pogo-pin supporting casing portion 104. The printed board 102 is provided with a plurality of through holes 109 into which a first power supply pin 105 and a second power supply pin 106 in which voltage values to be applied are different, a GND pin 107, and the pogo-pins 103 coming into use for a signal pin 108 are each inserted, plating layers 116 being formed in inner surfaces of all the through holes 109 other than the through hole 109 through which the signal pin 108 passes. And, a first power supply layer 110 and a second power supply layer 111, and a GND layer 112 are formed in the printed board 102 as power plates, and are electrically connected to the plating layers 116 in the inner surfaces of the through holes 109 for each pogo-pin to which each layer corresponds.

Decoupling capacitors 113 are formed by the use of an electrostatic capacity of a separator comprising dielectric and the like laminated between the power supply layers 110 and 111, and the GND layer 112. It should be noted that FIG. 4 and FIG. 5 illustrate two types of power supply pins, but there are no restrictions on the number of voltage types to be applied. In addition, the pogo-pin supporting casing portion 104 has similar casing holes 114 at positions corresponding to the through holes 109 of the printed board 102. The printed board 102 is overlapped on the upper surface side of the pogo-pin supporting casing portion 104, crimped or mechanically joined by the use of binding material, and integrated as the casing of the LSI socket 101, as shown in FIG. 2. It should be noted that plating layers are not being formed in inner surfaces of the casing holes 114.

And, the pogo-pins 103 are inserted into holes in which hole positions of the through holes 109 and the casing holes 114 are matched, thereby providing the realization of structure as a final LSI socket 101. It should be noted that the pogo-pins 103 are inserted from the upper surface side where the printed board 102 is disposed, and fixed by stoppers 115 formed in lower portions of the casing holes 114 of the pogo-pin supporting casing portion 104. Here, an electrical connection of the first and second power supply layers 110 and 111, the GND layer 112, and the pogo-pins 103 is achieved by mechanical contact of conductive material for the pogo-pins 103 to the plating layers 116 in the inner surfaces of the through holes 109 in consideration of socket pin replacement ease.

When conducting a test using the LSI socket shown in thus configured FIG. 5, solder balls of a BGA package not shown are brought into contact with upper edges of the pogo-pins 103 and lower edges of the pogo-pins 103 are brought into contact with test board pads not shown to achieve the electrical contact by means of the spring force of the pogo-pins.

In accordance with the present embodiment, a printed board containing decoupling capacitors is disposed in an area closer to LSI side enclosed in a BGA package based on the aforementioned structure, while responding to the socket pin replacement ease and a plurality of power supplies of LSI in recent years, thus providing excellent characteristics without being affected by the inductance component of an LSI socket pin.

(Second Embodiment)

Next, a second embodiment of the present invention will be described with reference to the drawings. FIG. 6 is an exploded longitudinal sectional view showing each component comprising an LSI socket for BGA in accordance with the second embodiment. FIG. 7 is a longitudinal sectional view showing the LSI socket for BGA in accordance with the second embodiment.

As shown in FIG. 6, an LSI socket 201 in accordance with the present invention is composed of four components: pogo-pin lower portion components 203A, a printed board 202, pogo-pin upper portion components 203B, and a pogo-pin supporting casing portion 204. The printed board 202 is provided with a plurality of through holes 209 into which a first power supply pin 205 and a second power supply pin 206 in which voltage values to be applied are different, a GND pin 207, and pogo-pins 203 (consisting of 203A and 203B) coming into use for a signal pin 208 are each inserted, plating layers 216 being formed in inner surfaces of all the through holes 209. And, a first power supply layer 210, a second power supply layer 211, and a GND layer 212 are formed in the printed board 202, and electrically connected to the plating layers 216 in the inner surfaces of the through holes 209 for the pogo-pins to which each layer corresponds.

Decoupling capacitors 213 are formed by the use of an electrostatic capacity of a separator comprising dielectric and the like laminated between the power supply layers 210 and 211, and the GND layer 112. It should be noted that FIG. 6 and FIG. 7 illustrate two types of power supply pins, but there are no restrictions on the number of voltage types to be applied. In addition, the pogo-pin supporting casing portion 204 has similar casing holes 214 at positions corresponding to the through holes 209 of the printed board 202.

The pogo-pin lower portion components 203A are inserted into the through holes 209 of the printed board 202, and fixed by soldering treatment through plating layers 216. Next, springs and the pogo-pin upper portion components 203A are fitted into the pogo-pin lower portion components 203A which are fixed to the printed board 202, and further disposed so as to put the pogo-pin supporting casing portion 204 therefrom. In this case, the pogo-pin upper portion components 203B are fixed by stoppers 215 provided on upper portions of the casing holes 214.

And, as shown in FIG. 7, the printed board 202 is disposed on the under side of the pogo-pin supporting casing portion 204, fixed by screws, and the like not shown in consideration of a pogo-pin replacement ability, and integrated as the casing of the LSI socket 201.

In accordance with the present embodiment, the structure described above provides better electrical connections of conductive portions of the pogo-pin lower portions to the decoupling capacitors, thereby making the LSI socket suitable for application in which a high current flows, provided that the printed board containing the decoupling capacitors is disposed in a direction distant from LSI side, so that there are some effects of the inductance component of the LSI socket pin, and perfect replacement ease of the socket pin is sacrificed.

INDUSTRIAL APPLICABILITY

The present invention is an LSI socket used when testing LSI enclosed in a BGA package at high frequencies, and allows the replacement of a contact pin and low-cost manufacturing by adopting pogo-pin structure, thus increasing its applicability.

It is to be understood that the present invention is applicable to anything that relates to the LSI socket used when testing the LSI enclosed in the BGA package at high frequencies, and is not intended to be limited in its applicability.

While the present invention has been described in relation to some preferred embodiments and exemplary embodiments, it is to be understood that these embodiments and exemplary embodiments are for the purpose of description by example, and not of limitation. While it will be obvious to those skilled in the art upon reading the present specification that various changes and substitutions may be easily made by equal components and art, it is obvious that such changes and substitutions lie within the true scope and spirit of the appended claims.

BRIEF DESCRIPTION OF THE DRAWINGS

FIG. 1 is a longitudinal sectional view showing the structure of a conventional pogo-pin;

FIG. 2A is a longitudinal sectional view showing the structure for the case of inserting a conventional pogo-pin from beneath;

FIG. 2B is a longitudinal sectional view showing the structure for the case of inserting the conventional pogo-pin from above;

FIG. 3A is a longitudinal sectional view showing the structure of a conventional LSI socket, and is a longitudinal sectional view showing the structure for the case of inserting a pogo-pin from beneath;

FIG. 3B is a longitudinal sectional view showing the structure of the conventional LSI socket, and is a longitudinal sectional view showing the structure for the case of inserting the pogo-pin from above;

FIG. 4 is an exploded longitudinal sectional view showing an LSI socket in accordance with a first embodiment of the present invention;

FIG. 5 is a longitudinal sectional view showing an LSI socket in accordance with a first embodiment of the present invention;

FIG. 6 is a structural exploded view showing an LSI socket in accordance with a second embodiment of the present invention; and FIG. 7 is a longitudinal sectional view showing an LSI socket in accordance with a second embodiment of the present invention.

The invention claimed is:

1. An LSI test socket for BGA, comprising:
    a printed board containing at least one or more decoupling capacitors in which a first power plate connected to an inner surface of a first through hole and a second power plate connected to an inner surface of a second through hole are laminated through a separator;
    a pogo-pin supporting casing portion on which said printed board is overlapped into a single piece, and in which at least one or more pairs of first and second casing holes are each opened at positions corresponding to said first and second through holes; and
    at least one or more pairs of first and second pogo-pins inserted into penetrating holes in which hole positions of said first and second through holes drilled in said printed board, and said first and second casing holes are allowed to be matched,
    wherein one end of the printed board faces a BGA package, said pogo-pin supporting casing portion being disposed at the other end thereof at the time of testing LSI incorporated in the BGA package.

2. The LSI test socket for BGA according to claim 1, wherein power supply layers each corresponding to said first and second power plates and one GND layer are formed in said printed board, the decoupling capacitors being formed by the use of an electrostatic capacity between the power supply layers and the GND layer.

3. The LSI test socket for BGA according to claim 1, wherein in said printed board, plating layers are formed in inner surfaces of through holes into which power supply pogo-pins and a GND pogo-pin are inserted, except for a through hole into which a signal pogo-pin is inserted.

4. The LSI test socket for BGA according to claim 1, wherein said pogo-pin supporting casing portion is made of non-conductive material, and plating layers are not formed in inner surfaces of the casing holes.

5. The LSI test socket for BGA according to claims 2 or 3, wherein said power supply layers are electrically connected to the plating layers in the inner surfaces of the through holes into which the power supply pogo-pins are inserted, said GND layer being electrically connected to the plating layer in the inner surface of the through hole into which the GND pogo-pin is inserted.

* * * * *